United States Patent
Lee et al.

(10) Patent No.: US 9,742,404 B2
(45) Date of Patent: Aug. 22, 2017

(54) LEVEL SHIFTER CIRCUIT WITH IMPROVED TIME RESPONSE AND CONTROL METHOD THEREOF

(71) Applicant: Silicon Works Co., Ltd., Daejeon (KR)

(72) Inventors: Seung Jong Lee, Gyeonggi-Do (KR); Young Jin Woo, Daejeon (KR); Hoo Hyun Cho, Seoul (KR)

(73) Assignee: Silicon Works Co., Ltd., Daejeon (KR)

( * ) Notice: Subject to any disclaimer, the term of this patent is extended or adjusted under 35 U.S.C. 154(b) by 0 days.

(21) Appl. No.: 14/822,402

(22) Filed: Aug. 10, 2015

(65) Prior Publication Data

US 2016/0204770 A1    Jul. 14, 2016

Related U.S. Application Data

(63) Continuation of application No. PCT/KR2015/000324, filed on Jan. 13, 2015.

(51) Int. Cl.
   *H03L 5/00*      (2006.01)
   *H03K 19/00*     (2006.01)
   *H03K 19/017*    (2006.01)
   *H03K 19/0185*   (2006.01)

(52) U.S. Cl.
   CPC ...   *H03K 19/0013* (2013.01); *H03K 19/01714* (2013.01); *H03K 19/018521* (2013.01); *H03K 19/018528* (2013.01)

(58) Field of Classification Search
   CPC ................................................ H03K 3/356104
   See application file for complete search history.

(56) References Cited

U.S. PATENT DOCUMENTS

| | | |
|---|---|---|
| 5,160,854 A | 11/1992 | Martignoni et al. |
| 5,216,290 A | 6/1993 | Childers |
| 5,397,967 A | 3/1995 | Carobolante et al. |
| 5,742,196 A | 4/1998 | Fronen et al. |
| 5,796,276 A | 8/1998 | Phillips et al. |
| 6,008,687 A | 12/1999 | Orita et al. |
| 6,046,577 A | 4/2000 | Rincon-Mora et al. |
| 6,201,429 B1 | 3/2001 | Rosenthal |

(Continued)

FOREIGN PATENT DOCUMENTS

| | | |
|---|---|---|
| EP | 0577367 B1 | 1/1994 |
| JP | 1997-147587 A | 6/1997 |

(Continued)

*Primary Examiner* — Daniel Puentes
(74) *Attorney, Agent, or Firm* — Mintz Levin Cohn Ferris Glovsky and Popeo, P.C.; Kongsik Kim; Colleen H. Witherell

(57) ABSTRACT

A level shifter circuit with improved time response and a control method thereof are disclosed herein. The level shifter circuit includes the output stage circuit of a level shifter and a booster circuit. The output stage circuit of the level shifter includes a first pass switch configured to transfer a voltage level of the first power supply of the level shifter to an output node, and a second pass switch connected between a second power supply and the first pass switch. The booster circuit accelerates the switching operation of the level shifter by accelerating a time response during the turning on or off operation of the first pass switch using charge sharing between a first capacitor and the parasitic capacitance of the control node of the first pass switch, which occurs via a first switch.

18 Claims, 11 Drawing Sheets

(56) References Cited

U.S. PATENT DOCUMENTS

| | | |
|---|---|---|
| 6,522,178 B2 | 2/2003 | Dubhashi et al. |
| 6,727,742 B2 | 4/2004 | Mariani et al. |
| 6,774,673 B2 | 8/2004 | Tsuboi et al. |
| 6,774,695 B2 | 8/2004 | Hayashi et al. |
| 6,784,719 B2 | 8/2004 | Okamoto et al. |
| 6,809,553 B2 | 10/2004 | Morini et al. |
| 6,946,893 B2 | 9/2005 | Hayashi et al. |
| 7,206,228 B2 | 4/2007 | Park |
| 7,508,247 B2 | 3/2009 | Tseng et al. |
| 7,683,672 B2 | 3/2010 | Bartlett |
| 7,750,687 B2 | 7/2010 | Muhlbacher et al. |
| 7,812,660 B2 | 10/2010 | Tamura |
| 7,893,730 B2 | 2/2011 | Jung et al. |
| 8,299,765 B2 | 10/2012 | Hirano |
| 8,773,095 B2 | 7/2014 | Gakhar et al. |
| 2003/0137336 A1* | 7/2003 | Okamoto ......... H03K 19/00323 327/333 |
| 2007/0075760 A1 | 4/2007 | Tseng et al. |
| 2009/0066422 A1* | 3/2009 | Bartlett ............ H03K 19/00361 330/296 |
| 2013/0033302 A1 | 2/2013 | Ali |
| 2014/0146429 A1 | 5/2014 | Lee et al. |

FOREIGN PATENT DOCUMENTS

| | | |
|---|---|---|
| JP | 2004-242084 A | 8/2004 |
| JP | 3717781 B2 | 11/2005 |
| JP | 3813538 B2 | 8/2006 |
| JP | 2009-130879 A | 6/2009 |
| JP | 2011-151579 A | 8/2011 |
| KR | 10-1996-0010386 | 7/1996 |
| KR | 10-0609576 | 4/2006 |
| KR | 10-0774893 B1 | 11/2007 |
| KR | 10-0804447 B1 | 2/2008 |
| KR | 10-0839551 B1 | 6/2008 |
| KR | 10-2010-0012815 | 2/2010 |
| KR | 10-1211829 | 11/2012 |
| KR | 10-2014-0070752 | 6/2014 |

* cited by examiner

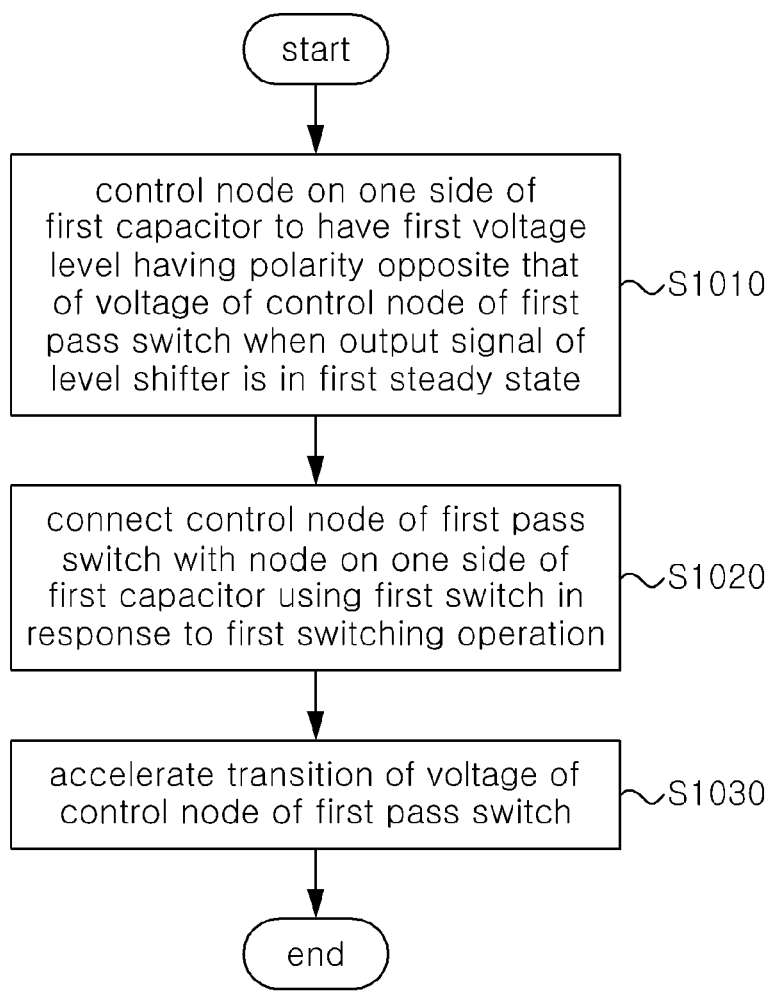

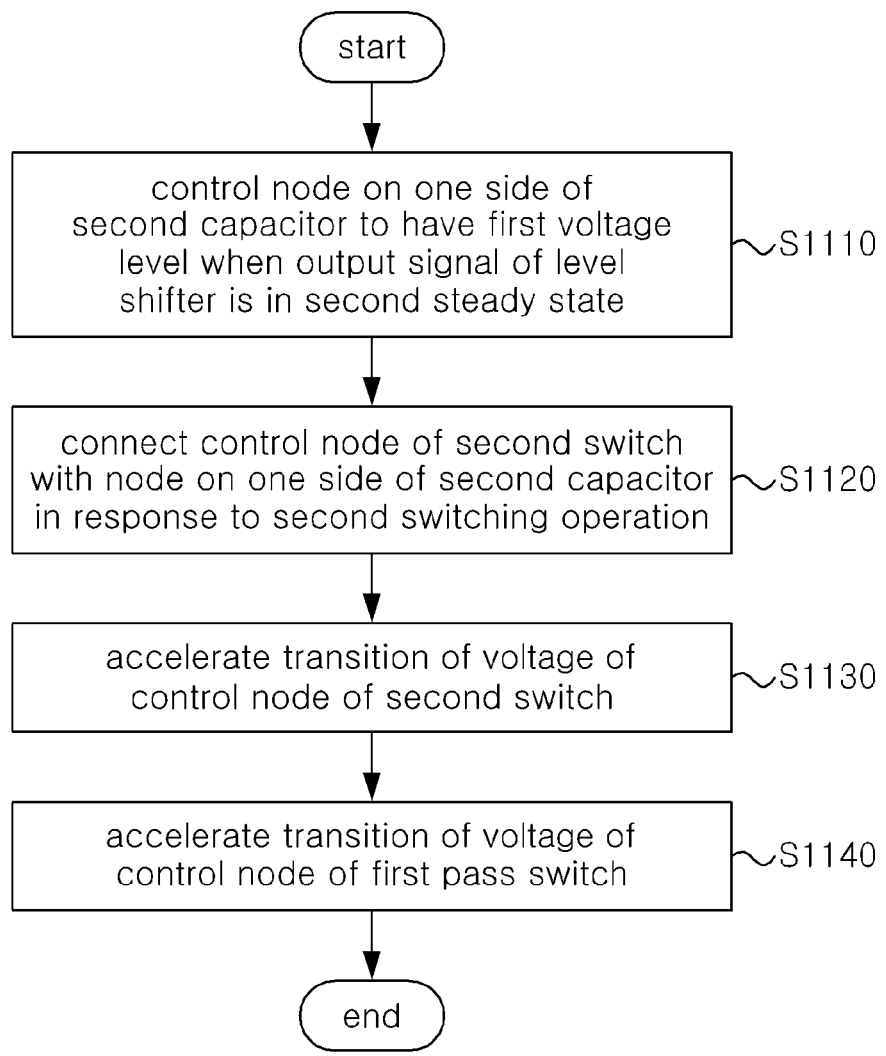

US 9,742,404 B2

LEVEL SHIFTER CIRCUIT WITH IMPROVED TIME RESPONSE AND CONTROL METHOD THEREOF

CROSS-REFERENCE TO RELATED APPLICATION

This application is a continuation of PCT/KR2015/000324 filed on Jan. 13, 2015, which application is incorporated herein by reference.

TECHNICAL FIELD

The present invention relates to a level shifter circuit for generating an output logic signal having a converted voltage level by converting the voltage level of an input logic signal, and more particularly to a level shifter circuit capable of improving time response characteristics, thereby enabling fast switching.

BACKGROUND ART

In electronic circuit applications supporting high-voltage switching operations, a circuit called a "level shifter" is used to transfer signals between circuit networks at different voltage levels. When a level shifter is combined with an inverter, the level shifter performs the function of converting a logic signal operating in the voltage range from 0 to V1 into an output signal operating in the voltage range from 0 to V2.

Furthermore, a level shifter also refers to a circuit for simply transferring a voltage level, rather than transferring a logic signal. In this case, when a predetermined logic condition is satisfied, a voltage level on an input side is transferred to an output side via a pass switch, and then the operation of raising or stepping down a voltage using a circuit, such as a bootstrap circuit or charge pump, is performed.

Examples of the typical circuits of such high-voltage level shifters are disclosed in U.S. Pat. No. 5,160,854 entitled "Single-Drive Level Shifter with Low Dynamic Impedance," U.S. Pat. No. 6,727,742 entitled "High-Voltage Level Shifting Circuit with Optimized Response Time," etc.

U.S. Pat. No. 6,727,742 discloses an example of the circuit of a conventional high-voltage level shifter, which is shown in FIG. 1.

Referring to FIG. 1, a level shifter circuit is shown, whose output voltage OUT swings between VBOOT and VPHASE in response to an input control signal Φ.

VBOOT, i.e., the upper limit of the output voltage VOUT, is generally high voltage power equal to or higher than 40 to 50 V, and VPHASE, i.e., the lower limit of the output voltage VOUT, is generally power having a voltage level lower than that of VBOOT by a predetermined difference. Generally, high-voltage level shifters are widely used in power devices that drive high current. When power devices are implemented using semiconductors, Double Diffused Metal Oxide Semiconductor (DMOS) transistors are widely used.

DMOS transistors include Vertical DMOS (VDMOS) transistors and Lateral DMOS (LDMOS) transistors. It is known that they have a high drain-source breakdown voltage ranging from about 40 to about 50 V in common, but it is very difficult to increase their gate-source voltage to a level of tens of volts because the gate-source voltage is determined based on the thickness of the channel oxide of the transistors.

Accordingly, a high-voltage level shifter is designed not to exceed the threshold of the gate-source voltage in order to ensure the safe operation of a DMOS transistor. For example, when the threshold of the gate-source voltage of the DMOS is 10 V in FIG. 1, the difference between VBOOT and VPHASE is determined to be equal to or less than 10 V.

To obtain electric potential VPHASE having a predetermined difference with VBOOT, the combination of a resistor R1 and a current source Idd and a clamping circuit M3 are widely used, as shown in FIG. 1.

When an input control signal Φ becomes ON, the current source Idd operates and accordingly a switch MHV is turned on, with the result that current Idd flows through the switch MHV. In this case, since all or part of the current Idd flows through the resistor R1, a difference in voltage occurs between VBOOT and a node 110 due to a voltage drop between both ends of the resistor R1. Since the node 110 corresponds to the voltage Vg of the gate nodes of M1 and M2, the transistor M1, i.e., a PMOS, is turned on, and thus output voltage OUT has the voltage level of VBOOT. Meanwhile, when the transistor M3 is turned on, a difference corresponding to the threshold voltage VT,M3 of the transistor M3 is present between the voltage VPHASE and the gate node of M3 and the voltage Vx of the node 110, i.e., the source node of M3. That is, a condition is set up by Equation 1 below:

$$Vx = VPHASE - VT,M3 \qquad (1)$$

When the transistor M3 is turned off when the potential difference between VPHASE and Vx reaches VT,M3, the current Idd flows through only the resistor R1. In this case, the voltage Vx of the node 110 satisfies the condition of Equation 2 below:

$$Vx = VBOOT - Idd \cdot R1 \qquad (2)$$

Accordingly, VPHASE, i.e., the lower limit of the output voltage OUT, satisfies Equation 3 below:

$$VPHASE = VBOOT - Idd \cdot R1 + VT,M3 \qquad (3)$$

That is, it can be seen that the difference between VPHASE, i.e., the lower limit of the output voltage VOUT, and VBOOT is determined by the current source Idd, the resistor R1 and the threshold voltage VT,M3 of the transistor M3.

In contrast, when the input control signal Φ becomes OFF, the current source Idd is cut off. In this case, since the current flowing through the resistor R1 becomes 0 when a sufficiently long time has passed, the voltage between both ends of the resistor R1 becomes 0 V. That is, Vx=VBOOT. In this case, the drain-source voltage of the transistor M3 is 0 V, and thus current does not flow through the transistor M3 still. Furthermore, since the voltage Vx is VBOOT and high, the transistor M2 is turned on, and thus the output voltage OUT has the voltage level of VPHASE.

Although the circuit of FIG. 1 would operate according to the above-described method when observation is conducted over a long time interval, a problem arises in that the operation is actually delayed due to the parasitic capacitances Cr and Cp of the node 110 shown in FIG. 1. In this case, Cr denotes the parasitic capacitance of the resistor R1, and Cp denotes the parasitic capacitance of the switch MHV.

When the input control signal Φ transitions from an OFF state to an ON state, the voltage Vx of the node 110 must drop from VBOOT to (VBOOT−Idd·R1). However, in practice, the transition from OFF state to ON state is slowly performed with an RC delay due to time constant R1·(Cr+

Cp). In the same manner, when the input control signal Φ transitions from an ON state to an OFF state, the voltage Vx of the node 110 must rise from (VBOOT−Idd·R1) to VBOOT. In practice, the transition from ON state to OFF state, Vx slowly reaches a steady state due to the time constant R1·(Cr+Cp).

This means that duration of a transient response increases considerably. In this case, when Vx has an intermediate level between VBOOT and VPHASE, there is a risk that the voltage of VPHASE transitions to a value close to VBOOT for the reason that the transistors M1 and M2 are turned on at the same time, or the like. To overcome this risk, inconvenience in circuit design arises in that reservoir capacitance corresponding to the node of VPHASE must be considerably high.

FIG. 2 is a diagram showing an improvement over the circuit of FIG. 1 proposed in U.S. Pat. No. 6,727,742.

Referring to FIG. 2, the gate node of a clamping transistor M3 is connected to output voltage OUT, not VPHASE. Accordingly, when an input control signal Φ remains in an ON state for a long time, Vx is clamped from VBOOT, i.e., the voltage level of the output voltage OUT, not from VPHASE. That is, Equation 4 below is formulated:

$$Vx = VBOOT - VT,M3 \quad (4)$$

According to this scheme, the swing range of Vx is reduced compared to Idd·R1 of FIG. 1, and accordingly the effect of speeding up the switching of the level shifter is achieved.

However, despite the improved circuit of FIG. 2, a problem still arises in that node 210 suffers from the delay of a time response attributable to an RC time constant.

Furthermore, another problem arises in that the improved circuit of FIG. 2 undergoes more difficulty in matching the threshold voltage characteristic of the transistors M1, M2 and M3 than the circuit of FIG. 1.

In the conventional art shown in FIG. 2, when the input control signal Φ transitions from an ON state to an OFF state (when Vx rises from a low voltage to a high voltage), the time required can be reduced, but this conventional art cannot provide a fundamental solution. As a result, a problem arises in that the rising and falling characteristics of Vx are determined based on an RC time constant.

Furthermore, the conventional art shown in FIG. 2 is problematic in that since the lower limit of Vx is determined to be (VBOOT−VT,M3), the transistor M2 is turned off at the lower limit of Vx and thus can achieve its intended purpose only if the threshold voltage VT,M2 of the transistor M2 is considerably high. For this purpose, the conventional art has a problem in that the condition of Equation 5 below must be satisfied:

$$VT,M2 > VBOOT - VT,M3 - VPHASE \quad (5)$$

In contrast, since the transistor M1 can achieve its intended purpose only if the transistor M1 is turned on at the lower limit of Vx, a problem arises in that the threshold voltage VT,M1 of the transistor M1 must satisfy Equation 6 below:

$$VT,M1 < VT,M3 \quad (6)$$

That is, the conventional art is problematic in that it cannot be a fundamental solution to an RC time delay and also it is very difficult to match the threshold voltage characteristics of transistors.

As a result, there is a demand for a circuit design technique that can overcome the delay of a time response attributable to an RC time constant while effectively protecting transistors in a high-voltage switching circuit or level shifting circuit as in the conventional art.

SUMMARY OF THE DISCLOSURE

Accordingly, the present invention has been made to solve the above problems occurring in the prior art, and an object of the present invention is to reduce RC delay and also improve time response characteristics in a level shifter circuit.

An object of the present invention is to provide a stable and fast high-voltage switching operation regardless of the characteristics of elements, such as the threshold voltages of transistors, etc., which constitute a circuit.

An object of the present invention is to deal with a wide voltage range in which a level shifter operates, to minimize operation-related limitations attributable to the characteristics of transistors, such as a breakdown voltage, etc., and to provide a high-voltage fast switching operation in various applications.

An object of the present invention is to improve the time response performance of a level shifter that generally converts the voltage operating range of a digital logic signal. More specifically, an object of the present invention is to improve time response performance while satisfying a low Vgs condition required to protect a pass switch that transfers a high voltage level.

An object of the present invention is to reduce the transient time it takes for the pass switch of the output stage circuit of a level shifter to reach a desired operating state, thereby reducing leakage current during the transient time.

An object of the present invention is to reduce the transient time it takes for a level shifter including a pass switch to reach a desired operating state, thereby reducing leakage current and/or direct-flowing current from VDD to GND, and also effectively achieving performance that an application intends to achieve.

In accordance with an aspect of the present invention, there is provided a level shifter circuit, including: the output stage circuit of a level shifter including a first pass switch configured to transfer a voltage level of the first power supply of the level shifter to an output node, and a second pass switch connected between a second power supply and the first pass switch; and a booster circuit configured to accelerate the switching operation of the level shifter by accelerating a time response during the turning on or off operation of the first pass switch. The booster circuit accelerates the switching operation using charge sharing, via a first switch, between a first capacitor and a parasitic capacitance of a control node of the first pass switch.

The booster circuit may accelerate the early stage transient response of the transition of the voltage of the control node of the first pass switch during the switching operation of the level shifter.

The booster circuit may include: a first capacitor configured such that a node on one side thereof has a voltage at a first voltage level when the output signal of the level shifter is in a first steady state; and a first switch configured to connect the node on one side of the first capacitor with the control node of the first pass switch when the switching operation that allows the output signal to depart from the first steady state is initiated.

When the first switch connects a node on one side of the first capacitor with the control node of the first pass switch, the transition of the voltage of the control node of the first pass switch may be accelerated by charge sharing between the parasitic capacitance of the control node of the first pass switch and the first capacitor, the transition of the turning on or off state of the first pass switch may be accelerated, and a transition in which the output signal departs from the first steady state may be accelerated.

The level shifter circuit may further include a bias circuit configured to control a voltage between the control node of the first pass switch and the first power supply to a predetermined level after the output signal has departed from a first steady state and before the output signal reaches a second steady state.

The level shifter circuit may further include a clamping circuit connected between the control node of the first pass switch and the first power supply, and regulates a voltage between the control node of the first pass switch and the first power supply so that the voltage does not exceed a critical range.

The booster circuit may include: a first booster circuit, i.e. an ON transition booster circuit, configured to accelerate a first switching operation in which the output signal departs from a first steady state, i.e. a low state, and reaches a second steady state, i.e. a high state, by accelerating a time response during the turning on operation of the first pass switch; and a second booster circuit configured to accelerate a second switching operation in which the output signal departs from the second steady state and reaches the first steady state by accelerating a time response during the turning off operation of the first pass switch.

In accordance with another aspect of the present invention, there is provided a level shifter circuit, including: the output stage circuit of a level shifter including a first pass switch configured to transfer a voltage level from the first power supply of the level shifter to an output node, and a second pass switch connected between a second power supply and the first pass switch; a first capacitor C1 configured such that a node on one side thereof has a voltage at a first voltage level when the voltage of the control node of the first pass switch is in a first state; and a first switch configured to connect the node on one side of the first capacitor with the control node of the first pass switch.

When the first switch is turned on, a transition of a voltage of the control node of the first pass switch from a first state to a second state is accelerated by charge sharing between a parasitic capacitance of the control node of the first pass switch and the first capacitor.

The level shifter circuit may further include a resistor connected between the control node of the first pass switch and the first power supply; and a current source connected to the control node of the first pass switch via the first switch. In this case, the resistor and the current source may form a bias circuit that maintains a voltage between the control node of the first pass switch and the first power supply to be substantially constant.

The level shifter circuit may further include a clamping circuit connected between the control node of the first pass switch and the first power supply. In this case, the clamping circuit may use an active element, such as a Zener diode, and may regulate the voltage between the control node of the first pass switch and the first power supply a voltage so that the voltage does not exceed a critical voltage.

The level shifter circuit may further include a second booster circuit configured to accelerate the transition of the voltage of the control node of the first pass switch from a second state to a first state. In this case, the second booster circuit may further include: a second switch connected between the control node of the first pass switch and the first power supply; a third switch connected to the control node of the second switch; and a second capacitor configured such that a node on one side thereof is connected to the control node of the second switch via the third switch and has a second voltage level when the voltage of the control node of the first pass switch is in a second state.

In the level shifter circuit including the second booster circuit, when the third switch is turned on, the transition of the voltage of the control node of the second switch may be accelerated by charge sharing between the parasitic capacitance of the control node of the second switch and the second capacitor, and the transition of the voltage of the control node of the first pass switch from the second state to the first state may be accelerated in response to the accelerated transition of the voltage of the control node of the second switch.

In accordance with still another aspect of the present invention, there is provided a method of controlling a level shifter, including: controlling the first capacitor of a booster circuit to have a first state value when the output signal of a level shifter generated by an output stage circuit including a first pass switch and a second pass switch is in a first steady state; and accelerating the switching operation of the first pass switch based on the first state value of the first capacitor in response to a first switching operation in which the output signal transitions from the first steady state to a second steady state. The accelerating is further based on charge sharing between the first capacitor and a parasitic capacitance of a control node of the first pass switch.

The accelerating the switching operation of the first pass switch may include accelerating the transition of the voltage of the control node of the first pass switch from a first state to a second state based on the first state value of the first capacitor.

The accelerating the switching operation of the first pass switch may include: connecting the control node of the first pass switch with a node on one side of the first capacitor using the closing operation of the first switch that is connected between the control node of the first pass switch and the node on one side of the first capacitor (by the turning on of the first switch); and accelerating the transition of the voltage of the control node of the first pass switch based on a difference between the first state value of the first capacitor and the state value of the first state of the control node of the first pass switch.

The accelerating the switching operation of the first pass switch may include accelerating the transition of the voltage of the control node of the first pass switch from a first state to a second state using charge sharing between the first capacitor, having the first state value, and the parasitic capacitance of the control node of the first pass switch.

The method may further include: controlling the second capacitor of the booster circuit to have a second state value when the output signal of the level shifter is in the second steady state; and accelerating the switching operation of the first pass switch based on the second state value of the second capacitor in response to a second switching operation in which the output signal transitions from the second steady state to the first steady state.

The accelerating the switching operation of the first pass switch based on the second state value of the second capacitor may include: accelerating the transition of the voltage of the control node of a second switch, connected to the control node of the first pass switch, using the closing operation of a third switch that is connected between the control node of the second switch and a node on one side of the second capacitor; and accelerating the transition of the voltage of the control node of the first pass switch from a second state to a first state in response to the accelerated transition of the voltage of the control node of the second switch.

The accelerating the switching operation of the first pass switch based on the second state value of the second capacitor may include: accelerating the transition of the voltage of the control node of a second switch, connected to the control node of the first pass switch, using charge sharing between the control node of the second switch and a node on one side of the second capacitor; and accelerating the transition of the voltage of the control node of the first pass switch from a second state to a first state in response to the accelerated transition of the voltage of the control node of the second switch.

BRIEF DESCRIPTION OF THE DRAWINGS

FIG. 10 is an operation flowchart showing a method of controlling a level shifter circuit according to an embodiment of the present invention; and FIG. 11 is an operation flowchart showing a method of controlling a level shifter circuit according to another embodiment of the present invention.

DETAILED DESCRIPTION OF THE DISCLOSURE

Embodiments of the present invention will be described in detail with reference to the accompanying drawings. In the following description of the present invention, detailed descriptions of related well-known components or functions that may unnecessarily make the gist of the present invention obscure will be omitted.

The prevent invention is not limited to the embodiments. Throughout the accompanying drawings, the same reference symbols are assigned to the same components.

Figure 3:
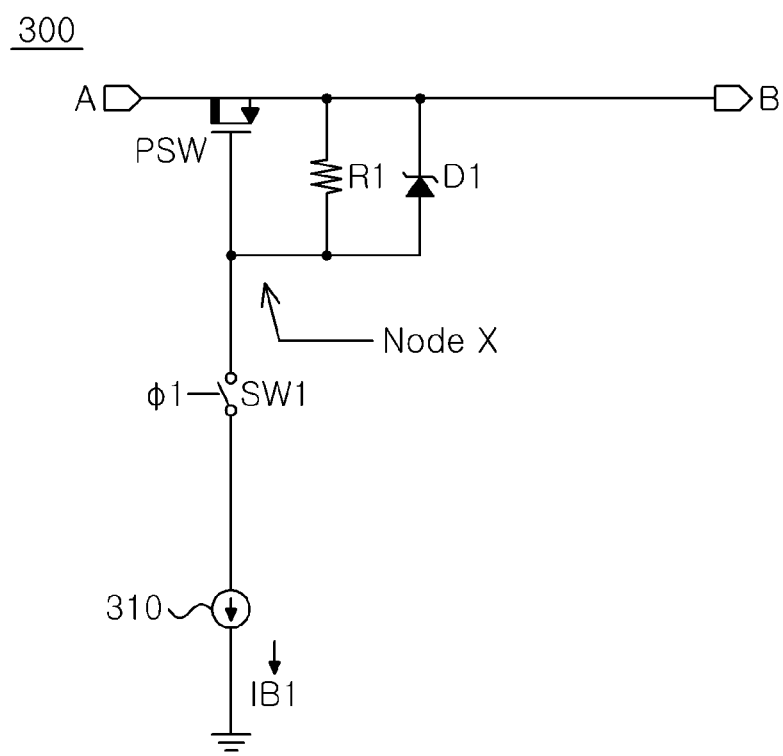
FIG. 3 is a diagram showing a pass switch, which is a portion of a level shifter circuit according to an embodiment of the present invention.

FIG. 3 is a diagram showing a portion 300 of a pass switch circuit according to an embodiment of the present invention.

Referring to FIG. 3, a first pass switch PSW configured to transfer the voltage level of an input node A to an output node B is shown. Although a P-type pass switch is shown as the first pass switch in FIG. 3, the idea of the present invention is not limited thereto. The first pass switch PSW is an element configured to transfer the voltage level of the input node A to the output node B, and may be any one of a P-type pass switch and an N-type pass switch. Furthermore, it is sufficient if the voltage level of the output node B is determined based on the voltage level of the input node A at the first pass switch PSW, and the voltage level of the output node B is not necessarily the same as the voltage level of the input node A.

More specifically, the first pass switch PSW may be an element that transfers a high voltage in a high voltage application, and may be implemented as a DMOS- or LDMOS-type transistor as shown in FIG. 3.

Furthermore, in FIG. 3, the drain node of the first pass switch PSW is illustrated as the input node A, and the source node thereof is shown as the output node B. This is design that provides for a case where the voltage level of the output node B is higher than that of the input node A. It will be also apparent to those skilled in the art that in the opposite case, the locations of the drain and the source may be interchanged with each other.

Referring to FIG. 3, the first pass switch PSW is a P-type LDMOS. The LDMOS is an element that is configured to have a generally increased drain-source breakdown voltage. Accordingly, when the drain-source voltage of the first pass switch PSW is equal to or lower than breakdown voltage, there is no problem with operation. However, the gate-source voltage of the first pass switch PSW has a considerably lower threshold voltage than breakdown voltage, and a circuit that regulates gate-source voltage is required in a circuit including the first pass switch PSW, such as that of FIG. 3. Since the control node of the first pass switch PSW is a node X, a circuit that regulates the gate-source voltage of the first pass switch PSW is a circuit that regulates the voltage Vx of the node X within a predetermined range.

For this purpose, a current source 510 and a resistor R1 are configured as a bias circuit. When input control signal Φ1 becomes ON, the first switch SW1 is short-circuited (closed), and bias current IB1 from the current source 510 flows from the output node B through a resistor R1 and the node X. In this case, when reaching a steady state steady state after passing through a transient response, the gate-source voltage of the first pass switch PSW is kept constant at IB1·R1.

Further, even when an accidental event, such as a case where the voltage of the output node B abruptly increases, other than the switching of the first switch SW1 in response to a input control signal 11, occurs, a Zener diode D1 may be connected in parallel with a resistor R1 between the gate and source of the first pass switch PSW as a clamping circuit in order to regulate the gate-source voltage of the first pass switch PSW within a threshold voltage. The clamping circuit regulates the gate-source voltage of the first pass switch PSW within the threshold voltage even in an instantaneous transient state, with the result that the first pass switch PSW can be protected by preventing the destruction of the first pass switch PSW.

Further, although not shown in FIG. 3 in detail, the first switch SW1 may be an N-type LDMOS. For example, when the input control signal Φ1 becomes ON (=high), the voltage of the node X, i.e., the control node of the first switch SW1, becomes high, and thus the first switch SW1 is turned on/short-circuited/activated. In contrast, when the input control signal Φ1 becomes OFF (=low), the voltage of the node X, i.e., the control node of the first switch SW1, becomes low, and thus the first switch SW1 is turned off/opened/deactivated. Since the upper limit of the voltage of the drain node of the first switch SW1 follows the voltage of the output node B, drain-source voltage may be high, and thus an element having high breakdown voltage, such as an LDMOS, may be adopted. In this case, since the input control signal Φ1 may influence the gate-source voltage of the first switch SW1, the input control signal Φ1 may operate within a voltage range from 0 to VDD, and a value lower than the gate-source threshold voltage of the LDMOS may be selected as VDD.

When a transient response is made and then a steady state is reached after the input control signal Φ1 has become OFF and thus the first switch SW1 has been opened, current does not flow through the resistor R1, and thus voltage between both ends of the resistor R1 becomes 0 V. Accordingly, the voltage Vx of the node X follows the voltage level of the output node B.

When the first pass switch PSW is disposed as shown in FIG. 3 in accordance with an application, it functions as a type of unidirectional switch similar to a diode. For example, the state in which the input control signal Φ1 becomes OFF and thus the first switch SW1 is opened, with the result that the voltage of the node X is high is assumed.

In this case, the voltage of the node X follows the voltage of the output node B, as described above. In this case, the gate and source of the first pass switch PSW come to have the same voltage level, and thus this becomes equivalent to a diode having a forward direction from the input node A to the output node B due to a P-N junction between the input node A and the control node X. In this case, when the voltage of the input node A is higher than the voltage of the output node B, the output node B comes to have a voltage level into which a voltage drop corresponding to the voltage of the input node A versus the threshold voltage has been incorporated. In contrast, when the voltage of the input node A is lower than the voltage of the output node B, the state in which a reverse bias is applied between the input node A and the output node B is entered, and thus current looks as if it did not flow through the first pass switch PSW.

Accordingly, in the circuit of FIG. 3, the first pass switch PSW may function as both a bidirectional switch and a unidirectional switch in accordance with the state of the input control signal Φ1.

Figure 1:
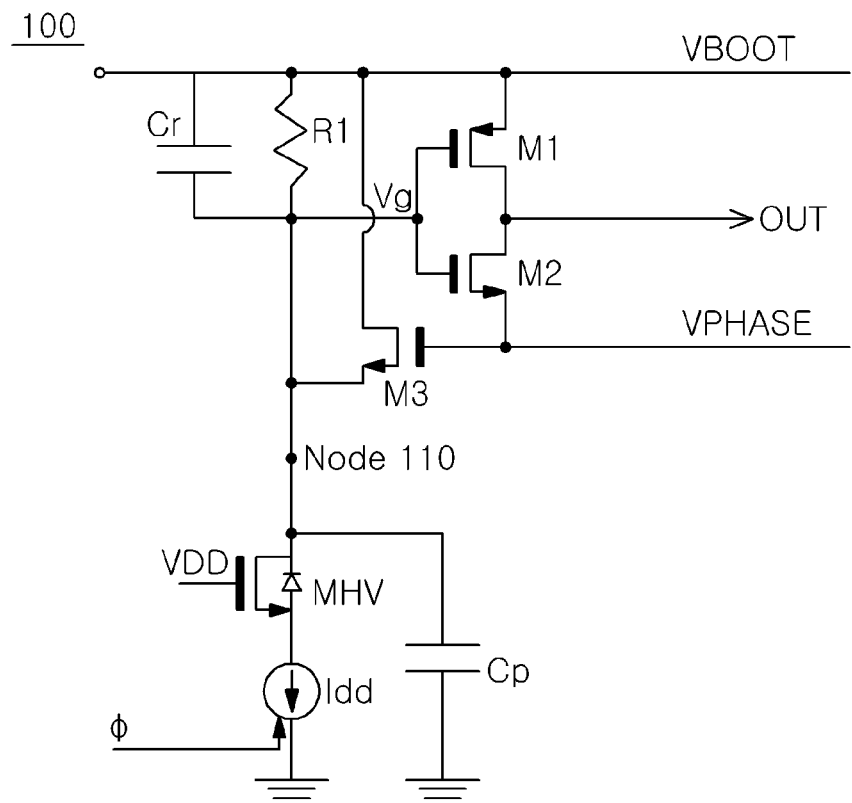
FIGS. 1 and 2 are diagrams showing examples of conventional high-voltage level shifting circuits.
Figure 2:
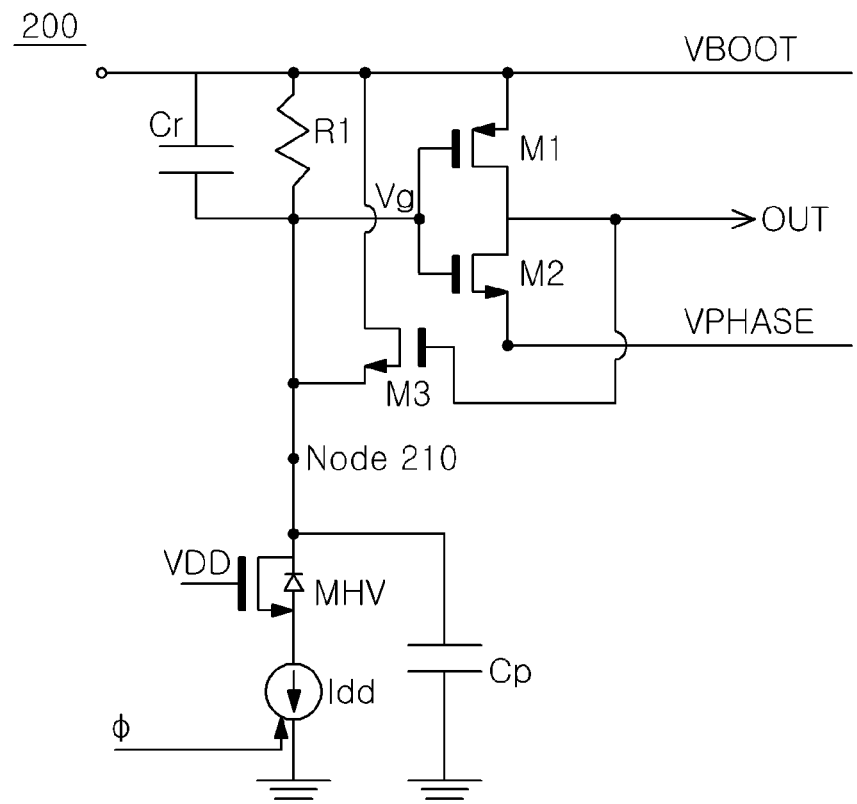

Although the circuit of FIG. 3 looks as if it successfully performed the function of a pass switch when a steady state is taken into account, a time response delay attributable to an RC time constant may occur when only the circuit of FIG. 3 is used, as shown in the conventional technology of FIGS. 1 and 2.

Figure 5:
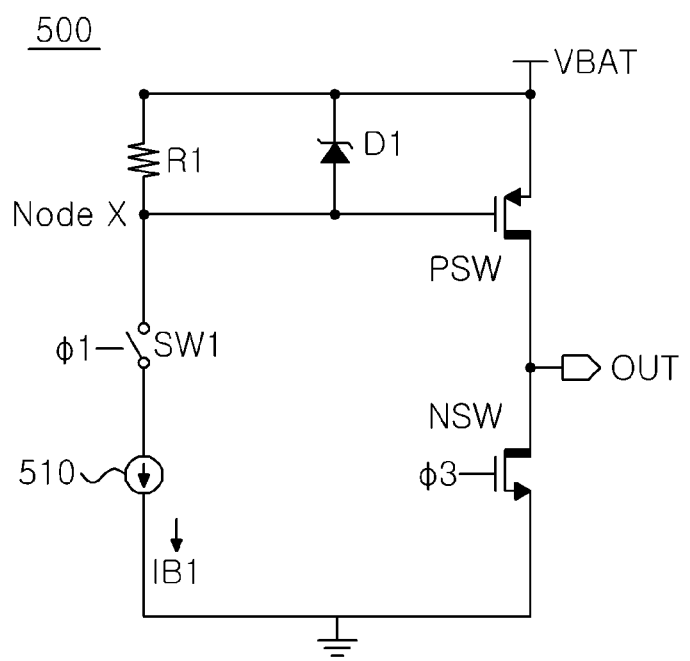
FIG. 5 is a diagram showing a portion of a level shifter circuit according to an embodiment of the present invention.

FIG. 5 is a diagram showing a portion of a level shifter circuit according to an embodiment of the present invention. FIG. 5 shows an example in which a complementary circuit is formed using the pass switch of FIG. 3 and a level shifter circuit is implemented using the complementary circuit.

In FIG. 5, a resistor R1 and a clamping diode D1 are the same as the resistor R1 and clamping diode D1 of FIG. 3. Furthermore, a current source 510 has the same function as the current source 310 of FIG. 3, and the source-gate voltage of a first pass switch PSW is uniformly regulated by the resistor R1 and the bias current IB1 of the current source 510 in the same manner.

The level shifter circuit of FIG. 5 includes the first pass switch PSW and a second pass switch NSW, and the first pass switch PSW and the second pass switch NSW may form the level shifter circuit as an output stage circuit. The first pass switch PSW and the second pass switch NSW are connected in parallel between a first power supply VBAT and a second power supply (ground (GND)), and an output signal OUT is generated based on the operation of the first pass switch PSW and the second pass switch NSW.

When the first power supply VBAT is a battery power supply for a vehicle, it has a voltage in the wide range from 10 to 60 V. Accordingly, sine the first pass switch PSW and the second pass switch NSW must operate in a relatively wide operating range, an embodiment in which the first pass switch PSW is implemented as a PDMOS and a second pass switch NSW is implemented as an NDMOS is shown in FIG. 5.

When a transient response is made and then a steady state is reached after the input control signal Φ1 has become OFF and thus the first switch SW1 has been opened, current does not flow through the resistor R1, and thus voltage between both ends of the resistor R1 becomes 0 V. Accordingly, the voltage Vx of the node X follows the voltage level of the first power supply VBAT. Furthermore, the first pass switch PSW is turned off and the second pass switch NSW is turned on, and thus the output signal OUT has a value of 0 V.

For ease of description, a case where the output signal OUT has a value of 0 V is referred to as a first steady state.

In this case, the input control signal Φ1 and another input control signal Φ3 have opposite phases. The reason for this is to prevent a case where all the first pass switch PSW and the second pass switch NSW are turned on, and thus a through current flows between the first power supply VBAT and the second power supply GND.

Furthermore, to prevent a case where all the first pass switch PSW and the second pass switch NSW are turned on and thus a through current flows between the first power supply VBAT and the second power supply GND, control is performed using time delay such that the input control signal Φ1 and the input control signal Φ3 do not become ON at the same time.

When a transient response is made and then a steady state is reached after the input control signal Φ1 has become ON and thus the first switch SW1 has been short-circuited, a voltage between both ends of the resistor R1 becomes IB1·R1 V due to bias current IB1 that flows through the resistor R1. Accordingly, the voltage Vx of the node X has a voltage level of VBAT−IB1·R1. When IB1·R1 is higher than the threshold voltage VT,PSW of the first pass switch PSW, the first pass switch PSW is turned on, and thus the output signal OUT follows the voltage level of the first power supply VBAT.

To prevent through current from flowing, the second pass switch NSW is turned off.

For ease of description, a case where the output signal OUT has the voltage level of the first power supply VBAT is referred to as a second steady state.

Although the circuit of FIG. 5 also looks as if it successfully performed the function of the level shifter circuit in the same manner as the circuit of FIG. 3 when a steady state is taken into account, a time response delay attributable to an RC time constant may occur when only the circuit of FIG. 5 is used, as described in conjunction with the conventional technologies of FIGS. 1 and 2.

Figure 7:
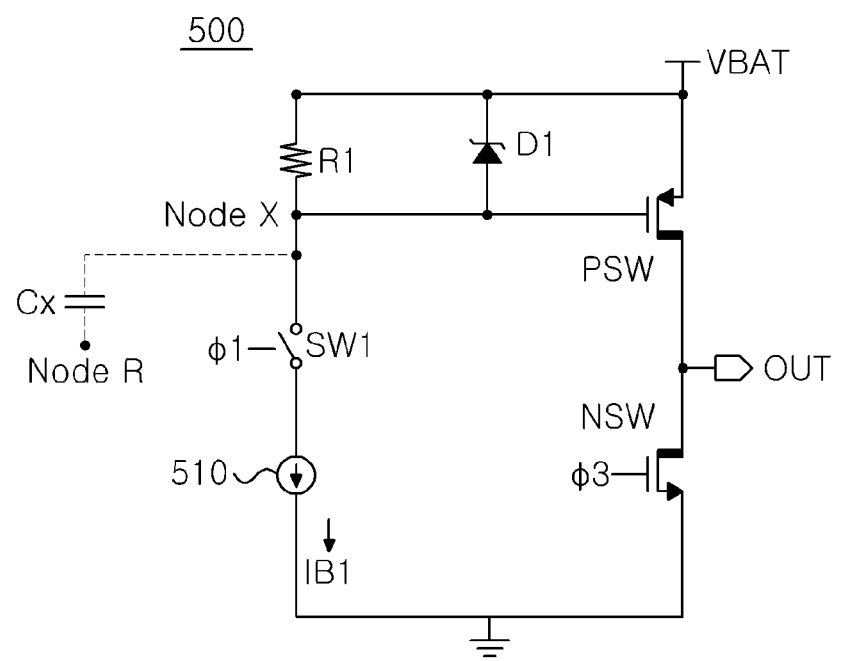
FIG. 7 is a diagram showing parasitic capacitance in order to describe the circuit of FIG. 5.

To effectively illustrate parasitic capacitance in the circuit of FIG. 5, a description is given with reference to FIG. 7.

FIG. 7 is a diagram showing parasitic capacitance Cx in order to describe the circuit of FIG. 5. Referring to FIG. 7, the parasitic capacitance Cx may be construed as being present between a node X and a virtual reference node R. In this case, although the node R may be considered to be a node that is the same as a ground GND for the sake of the simplicity of analysis in an embodiment, the idea of the present invention is not limited to this embodiment. Cx may be formed by including the influences of the parasitic junction capacitance of a first switch SW1 driven in response to an input control signal Φ1, the parasitic gate capacitance of a first pass switch PSW, the parasitic capacitance of a resistor R1, and the parasitic capacitance of a Zener diode D1.

Referring to FIG. 7, the transient response of the circuit of FIG. 5 is described in detail with reference to FIG. 4.

Figure 4:
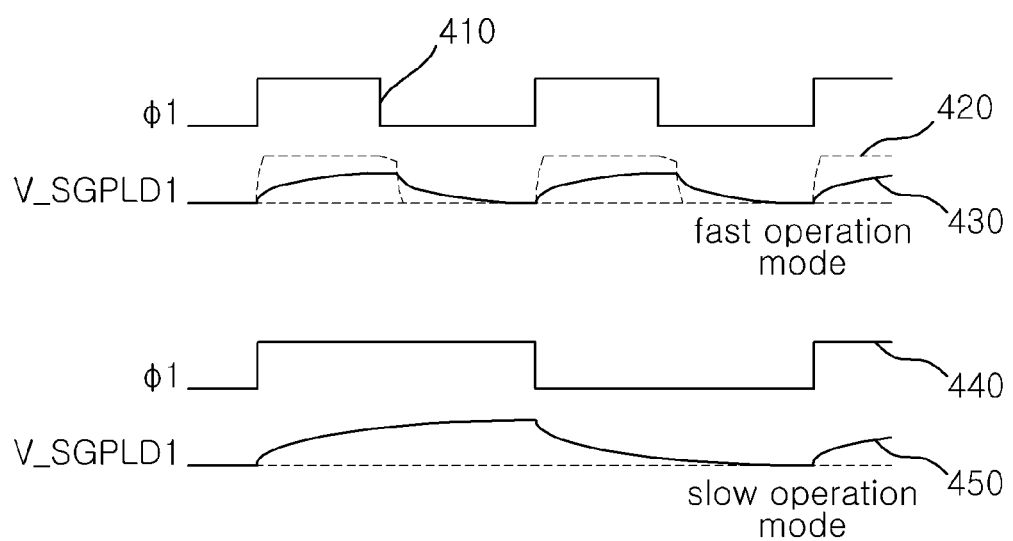
FIG. 4 is a diagram showing time response characteristics when an operation is performed using only the circuit of FIG. 3 or 5.

FIG. 4 is a diagram showing time response characteristics when an operation is performed using only the circuit of FIG. 3 or 5 in which part of an embodiment of the present invention has been constructed. Although the operation characteristics of FIG. 4 may be applied to both the cases of FIGS. 3 and 5, a description is given chiefly with regard to the circuit of FIG. 5 herein.

A waveform 410 is the form of the input control signal Φ1 during a fast operation, a waveform 420 is the form of the ideal source-gate voltage V_SGPSW of the first pass switch PSW during the fast operation, and a waveform 430 is the form of the actual source-gate voltage V_SGPSW of the first pass switch PSW during the fast operation. A waveform 440 is the form of the input control signal Φ1 during a slow operation, and a waveform 450 is the form of the source-gate voltage V_SGPSW of the first pass switch PSW during the slow operation. The waveform 420 of the ideal source-gate voltage V_SGPSW of the first pass switch PSW during the fast operation is switched in the voltage range from 0 to IB1·R1 while incorporating voltage IB1·R1 between both side nodes of the resistor R1 in a steady state thereto. The waveform 440 of the source-gate voltage V_SGPSW of the first pass switch PSW during the slow operation may also be switched in the voltage range from 0 to IB1·R1 when a sufficient time is given.

In the first steady state in which the input control signal Φ1 is OFF, the level of the voltage Vx of the node X is the same as the voltage level of the first power supply VBAT. Accordingly, the first pass switch PSW is in the state of being deactivated/turned off, and the source-gate voltage V_SGPSW of the first pass switch PSW is 0 V.

In this case, when the input control signal Φ1 transitions from an OFF state to an ON state, the first switch SW1 is activated/short-circuited and current starts to flow from the node X through the first switch SW1. In this case, V_SGPSW undergoes RC delay attributable to a time constant R1·Cx due to the combination of the parasitic capacitance Cx and the resistor R1.

Referring to the waveform 430, in the case of the fast operation in which the switching period of the input control signal Φ1 is shorter than the time constant R1·Cx, the first switch SW1 is deactivated/opened before the transient state is terminated, and thus the source-gate voltage V_SGPSW of the first pass switch PSW is not sufficiently developed. Accordingly, the first pass switch PSW is not sufficiently turned on, in which case it cannot sufficiently function as a pass switch.

Accordingly, when a level shifter circuit is formed using only the circuit of FIG. 5, the time for which the bias current IB1 is allowed to flow must be long when the first pass switch PSW is activated, in which case the efficiency of input energy versus output energy decreases.

Furthermore, when the first pass switch PSW is deactivated (when the input control signal Φ1 transitions from an ON state to an OFF state), current flows into the parasitic capacitance Cx through the resistor R1, and thus the voltage of the node X rises, which results in a very slow time response.

In an application, the first power supply VBAT may be a limited energy source, such as a battery for a vehicle. In this case, when the switching time and transient response time of the first pass switch PSW are long, there is a possibility that a plurality of charges leaks from the first power supply VBAT through the node X, and thus energy efficiency may degrade significantly.

In order to overcome this problem, a level shifter circuit according to an embodiment of the present invention proposes a new circuit in which a time delay RC has been reduced and time response characteristics have been improved. The newly proposed circuit is described with reference to FIGS. 6, and 8 to 11.

Figure 6:
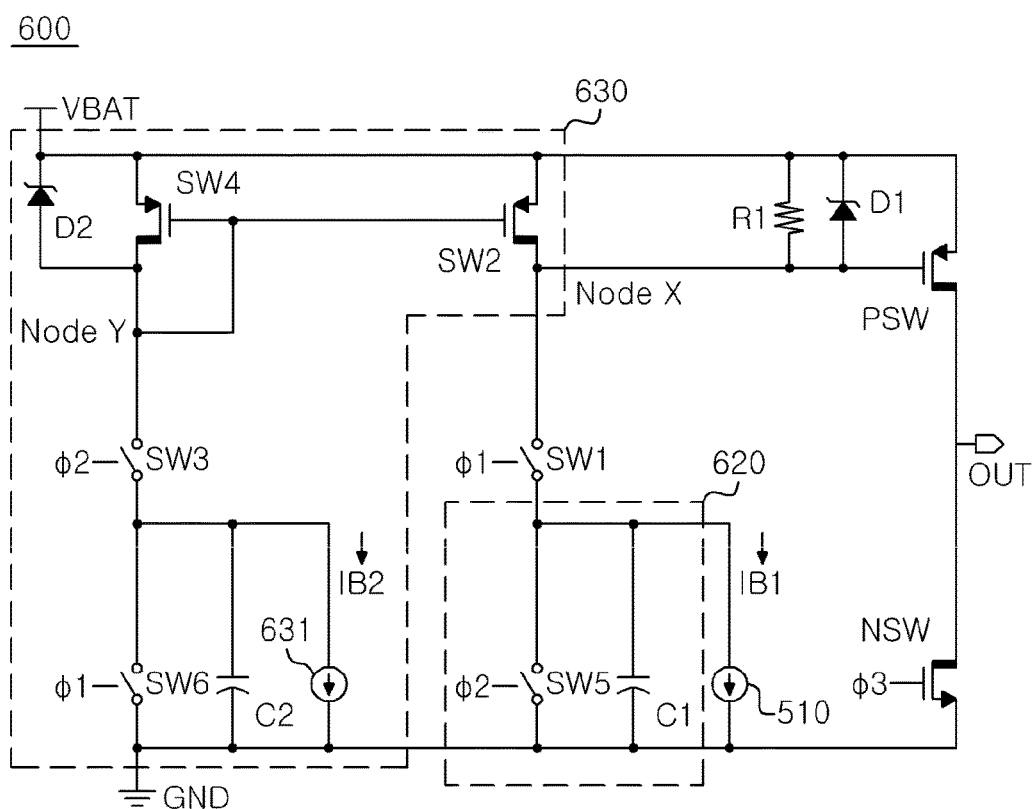
FIG. 6 is a diagram showing a level shifter circuit according to an embodiment of the present invention.

FIG. 6 is a diagram showing a level shifter circuit 600 according to an embodiment of the present invention.

Referring to FIG. 6, a first pass switch PSW, a resistor R1, a current source 510 configured to supply bias current IB1, a first switch SW1 configured to be controlled in response to the input control signal Φ1, a clamping diode D1, and a second pass switch NSW configured to be controlled in response to the input control signal Φ3 are shown in the same manner as shown in FIG. 5. Since this configuration is the same as that of FIG. 5, a redundant description is omitted. For example, although not shown in FIG. 6 in detail, the first switch SW1 may be implemented as an N-type LDMOS. Furthermore, the input control signal Φ1 may swing within the voltage range from 0 to VDD.

In FIG. 6, a first booster circuit 620 configured to accelerate a transient response during the OFF-to-ON operation of the first pass switch PSW (a first switching operation) is shown. Meanwhile, a second booster circuit 630 configured to accelerate a transient response during the ON-to-OFF operation of the first pass switch PSW (a second switching operation) is also shown.

The first booster circuit 620 and the second booster circuit 630 may not influence the steady state of the level shifter circuit 600, but may influence an operation in a transient state. Accordingly, the operations of the first pass switch PSW, resistor R1 and clamping diode D1 of FIG. 6 in a steady state are the same as described with reference to FIG. 5.

The first booster circuit 620 includes a first capacitor C1. In this case, a node on one side of the first capacitor C1 may be connected to a second power supply GND. Although a case where the second power supply is a ground GND is shown in FIG. 5, the first power supply is not necessarily a ground, but may be a constant reference voltage. For ease of description, in the following, it is assumed that the second power supply is a ground GND. An embodiment in which a fifth switch SW5 is connected in parallel between both terminals of the first capacitor C1 is shown in FIG. 5, the function of the fifth switch SW5 will be described below.

The second booster circuit 630 includes a second capacitor C2. In this case, a node on one side of the second capacitor C2 may be connected to the second power supply.

The second booster circuit 630 may further include a second switch SW2 connected between the first power supply VBAT and the node X, and a third switch SW3 connected between a node Y, i.e., the control node of the second switch SW2, and the second capacitor C2. In this case, the third switch SW3 is controlled in response to the input control signal Φ1 of the first switch SW1 and the input control signal Φ2 whose phase is inverted. That is, in a steady state, the third switch SW3 operates in the phase opposite to a phase in the operation of the first switch SW1.

The second booster circuit 630 may further include a fourth switch SW4, i.e., a current mirror for the second switch SW2, and may further include a clamping diode D2 connected between the node Y and the first power supply VBAT.

The second booster circuit 630 may further include a sixth switch SW6 connected in parallel between both side terminals of the second capacitor C2, and also a second current source 631 connected in parallel between both side terminals of the second capacitor C2 and configured to supply bias current IB2. The functions of the sixth switch SW6 and the second current source 631 will be described in greater detail below.

In the first steady state in which the input control signal Φ1 is OFF and the inverted input control signal Φ2 is ON, the third switch SW3 may be short-circuited and prompt the voltage of the node Y to a low voltage. The second switch SW2 functions to connect the node X with the first power supply VBAT in the first steady state in which the input control signal Φ1 is OFF. In this case, the voltage Vy of the node Y, i.e., the control node of the second switch SW2, has a voltage lower than the first power supply VBAT, and the difference between the first power supply VBAT and Vy may be determined by the breakdown voltage of the clamping diode D2. Alternatively, although not shown in FIG. 6, an additional resistor, such as R2, may be connected between the node Y and the first power supply VBAT, and the voltage between the first power supply VBAT and the node Y may be maintained at bias voltage IB2·R2 in the first steady state in which the input control signal Φ1 is OFF.

Although not shown in FIG. 6 in detail, the third switch SW3 may be an N-type LDMOS, like the first switch SW1, and the inverted input control signal Φ2 may also swing within the voltage range from 0 to VDD.

The third switch SW3 may be opened in the second steady state in which the input control signal Φ1 is ON and the inverted input control signal Φ2 is OFF, and the voltage of the node Y may be determined by the threshold voltage VT,SW4 of the fourth switch SW4. In the second steady state, both the control and drain nodes of the fourth switch SW4 are connected to the node Y, and the fourth switch SW4 functions as a type of diode. In this case, in the second steady state, current does not flow through the fourth switch SW4, and thus the node Y has a voltage lower than the voltage of the first power supply VBAT by VT,SW4. As described above, when a resistor, such as R2, is connected between the node Y and the first power supply VBAT, although not shown in FIG. 6, the voltage of the node Y will follow the voltage of the first power supply VBAT in the second steady state.

When the second switch SW2 and the fourth switch SW4 form a current mirror while possessing the same characteristic, the second switch SW2 may be deactivated/turned off in the same manner as the fourth switch SW4 in the second steady state.

To describe a transient response in the circuit of FIG. 6, it is necessary to understand parasitic capacitance. To effectively describe this, a description is given with reference to FIG. 8.

Figure 8:
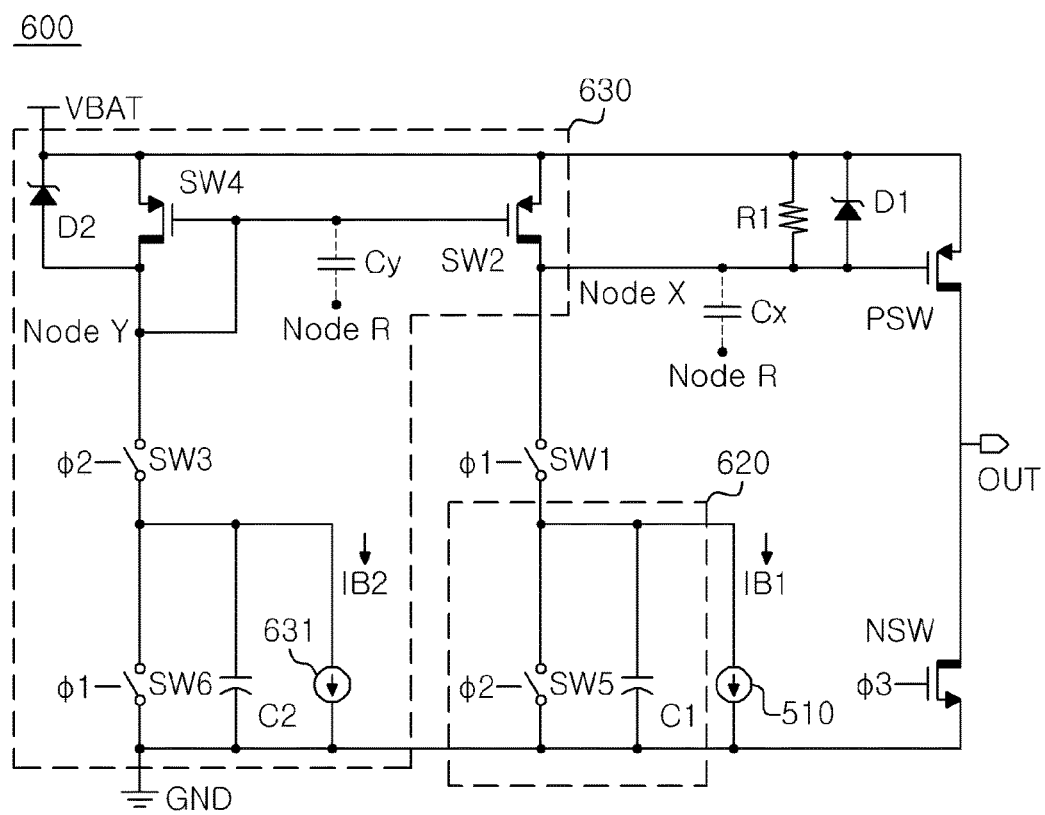
FIG. 8 is a diagram showing parasitic capacitances in order to describe the circuit of FIG. 6.

FIG. 8 is a diagram showing parasitic capacitances Cx and Cy in order to describe the circuit of FIG. 6. Referring to FIG. 8, it may be understood that the parasitic capacitance parasitic capacitance Cx is present between the node X and a virtual reference node and the parasitic capacitance Cy is present between the node Y and the virtual reference node. Cx may be formed by including the influences of the parasitic junction capacitance of the first switch SW1 configured to be controlled in response to the input control signal Φ1, the parasitic gate capacitance of the first pass switch PSW, the parasitic capacitance of the resistor R1, and the parasitic capacitance of the Zener diode D1. Cy may be formed by including the influences of the parasitic junction capacitance of the third switch SW3 configured to be controlled in response to the inverted input control signal Φ2, the parasitic gate capacitance of the second switch SW2 and the fourth switch SW4, and the parasitic capacitance of the clamping diode D2.

Referring to FIG. 8, the transient response of the circuit of FIG. 6 is described in detail with reference to the waveform of FIG. 9.

Figure 9:
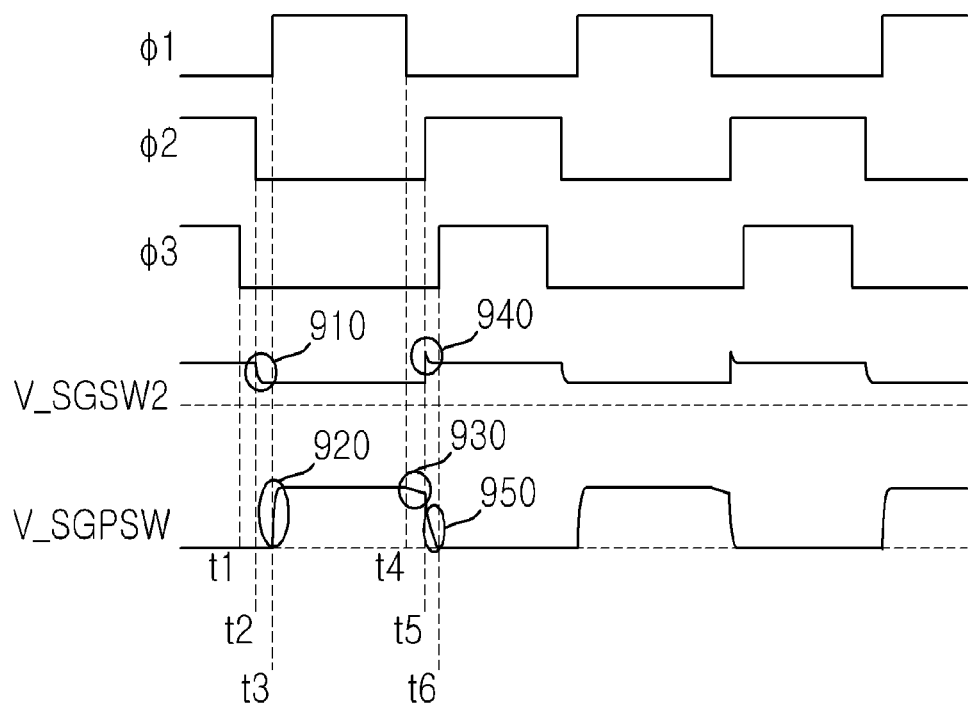
FIG. 9 is a diagram showing time response characteristics when the circuit of FIG. 6 or 8 operates.

FIG. 9 is a diagram showing time response characteristics when the circuit 600 of FIG. 6 or 8 operates according to an embodiment of the present invention.

The circuit 600 of FIG. 6 is in a first steady state (in which the input control signal Φ1 is OFF and D2 is ON) in a time interval where t<t1. In this case, the voltage Vx of the node X follows the voltage of the first power supply VBAT.

In the first steady state, nodes on both sides of the first capacitor C1 are all controlled to have the voltage level of the second power supply GND by the fifth switch SW5 within the first booster circuit 620.

When the input control signal Φ1 transitions from an OFF state to an ON state at time t=t3 (a first switching operation), the first switch SW1 is short-circuited and thus the first capacitor C1 and the node X are connected to each other. In this case, the parasitic capacitance Cx of the node X is in the state of being charged with the voltage of the first power supply VBAT, but charge sharing occurs between the first capacitor C1 and the parasitic capacitance Cx. In this case, the charge sharing is intended charge sharing. A conventional general bootstrap circuit or charge pump is used for the purpose of raising or stepping down the voltage of the gate node of a specific transistor by transferring charges, with which a capacitor is charged, to the gate node. In this case, the effect of the operation of the general bootstrap circuit or charge pump is reduced by the parasitic capacitance of the gate node and non-intended charge sharing. In contrast, the charge sharing according to the present invention is intended charge sharing using the parasitic capacitance Cx. When the first switch SW1 is short-circuited, the transition of the voltage of the node X is accelerated by intended charge sharing between the first capacitor C1 and the parasitic capacitance Cx. Assuming that the voltage Vx of the node X has a voltage level of Vx,o in the first steady state (when t<t1), the voltage Vx,o+ of the node X after the time t=t3 at which charge sharing has occurred may be obtained using Equation 7 below even when simple modeling is performed:

$$Vx,o+ = Vx,o \cdot Cx/(C1+Cx) \quad (7)$$

where C1 is the capacitance value of the first capacitor C1.

Equation 7 is not intended for accurate modeling, but is an equation introduced merely to describe the core concept of the present invention. Equation 7 corresponds to the result of simple modeling that is chiefly based on dominant parameters.

After the time t3 at which charge sharing has occurred, the time response of Vx is determined by time constant R1·(Cx+C1). This situation is shown by the curve 920 of FIG. 9. The present invention is different from the conventional technology only in that the start point of the time response of Vx is not Vx,o but Vx,o+, which is significantly reduced by charge sharing. For this reason, even when RC delay attributable to a time constant during a transient response is taken into account, Vx may transition rapidly toward the value of the second steady state. This situation is shown FIG. 9. From FIG. 9, it may be seen that the source-gate voltage V_SGPSW of the first pass switch PSW comes to have a value close to the bias value IB1·R1 of the second steady state almost at the same time that the input control signal Φ1 becomes ON.

In this case, although not shown FIG. 9, when the value of the first capacitor C1 is excessively high and thus the voltage of the node X excessively decreases, an overshoot phenomenon in which the source-gate voltage V_SGPSW of the first pass switch PSW instantaneously has a value higher than the bias value IB1·R1 in the second steady state may occur. In this case, the clamping diode D1 may perform regulation so that the source-gate voltage V_SGPSW of the first pass switch PSW exceeds a threshold voltage. Accordingly, it can be seen that when a circuit is formed as shown in FIG. 6, a high degree of freedom in design is present in connection with the determination of the value of the first capacitor C1.

In an application, for example, Vx,o+ may be 40 V, and Vx may be 30 V in the second steady state. In this case, it may be sufficient if the value of the first capacitor C1 is determined to be about ⅓ of the parasitic capacitance Cx. Even when an error occurs in the value of the modeled parasitic capacitance Cx due to a change in the temperature, manufacturing process or environment, a safety device, such as the clamping circuit D1, is present as described above, and thus a high degree of freedom in design is present in connection with the determination of the value of the first capacitor C1.

In this case, although the fifth switch SW5 is shown as short-circuiting nodes on both sides of the first capacitor C1 in the first steady state in FIG. 6, the idea of the present invention is not limited thereto, but the voltage between the nodes on both sides of the first capacitor C1 may be designed to have a predetermined value, not 0 V. In this case, it is sufficient if a voltage between the second power supply to which a node on one side of the first capacitor C1 is connected and the nodes on both sides of the first capacitor C1 in the first steady state can drop Vx,o in the first steady state using charge sharing. The voltage of a node on the other side of the first capacitor C1, not the node on one side of the first capacitor C1 connected to the first power supply, in the first steady state may be designed such that the target voltage of Vx in the second steady state is located between the voltage of the node on the other side of the first capacitor C1 in the first steady state and Vx,o in the first steady state. If the voltages of the first power supply VBAT are the same in the first steady state and in the second steady state, the target voltage Vx,1 of Vx in the second steady state may be expressed by Equation 8 below:

$$Vx,1 = Vx,o - IB1 \cdot R1 \quad (8)$$

That is, the target voltage Vx,1 of Vx in the second steady state is determined by the voltage of the first power supply VBAT in the second steady state and a bias voltage attributable to the bias circuit.

A transient response in the case where the input control signal 11 transitions from an ON state to an OFF state (a second switching operation) after the level shifter circuit 600 has rapidly reached the second steady state is made as follows.

First, since the input control signal Φ1 is in an ON state in the second steady state (in a time interval where t3<<t<t4), the sixth switch SW6 is short-circuited and thus nodes on both sides of the second capacitor C2 are short-circuited. In this case, the node on one side of the second capacitor C2 may be connected to the second power supply and the second power supply may correspond to a ground GND. However, the second power supply may correspond to a reference voltage at a different level, as described above. For ease of description, the following description is given on the assumption that the second power supply corresponds to a ground, as shown in FIG. 6. That is, in the second steady state, the nodes on both sides of the second capacitor C2 may be controlled to have a voltage of 0 V.

Furthermore, in the second steady state, the voltage of the node Y is formed with a voltage drop of the threshold voltage VT,SW4 of the fourth switch SW4 from the voltage of the first power supply VBAT incorporated thereto. That is, in the second steady state, the source-gate voltage V_SGSW2 of the second switch SW2 has a magnitude of VT,SW4.

When the input control signal Φ1 transitions from an ON state to an OFF state, the first switch SW1 is opened, and the voltage of the node X starts to be raised to follow the voltage of the first power supply VBAT by the resistor R1. Due to the presence of the resistor R1, the target voltage of the node X in the first steady state is the voltage of the first power supply VBAT, as described above. In this case, since the time response characteristics of the voltage Vx of the node X are determined based on the time constant R1·Cx, the transition of Vx occurs very slowly in this case. V_SGPSW of FIG. 9 is representative of (VBAT·Vx). Accordingly, as shown by the curve 930 of FIG. 9, a form in which V_SGPSW drops slightly after the input control signal Φ1 has transitioned from an ON state to an OFF state is representative of a transient response attributable to the time constant R1·Cx. That is, in a time interval where t4<t<t5 after the input control signal Φ1 has transitioned from an ON state to an OFF state and before the inverted input control signal Φ2 transitions from an OFF state to an ON state, Vx may follow the transient response attributable to the time constant R1·Cx.

Thereafter, at time t=t5, when the inverted input control signal Φ2 transitions from an OFF state to an ON state, the third switch SW3 is short-circuited, and the node Y and the second capacitor C2 are connected to each other. In this case, Vy may drop rapidly due to charge sharing between the parasitic capacitance Cy and the second capacitor C2. The charge sharing between the parasitic capacitance Cy and the second capacitor C2 is intentionally designed with the parasitic capacitance Cy taken into account. That is, the voltage drop of Vy may be accelerated by the intended charge sharing between the parasitic capacitance Cy and the second capacitor C2. The level shifter circuit of the present invention is differentiated from the conventional bootstrap circuit or charge pump in that the level shifter circuit of the present invention uses intended charge sharing while the effect of the operation of the conventional bootstrap circuit or charge pump is reduced by non-intended charge sharing. Referring to FIG. 9, as the inverted input control signal Φ2 transitions from an OFF state to an ON state, the source-gate voltage V_SGSW2 of the second switch SW2 increases rapidly, in which case the rapid increases results from charge sharing between the parasitic capacitance Cy and the second capacitor C2. Referring to FIG. 9, the source-gate voltage V_SGSW2 of the second switch SW2 is rapidly increased by charge sharing in a time interval where t>t5, and accordingly the source-gate voltage V_SGPSW of the first pass switch PSW may be rapidly decreased to 0. This situation is shown by the curve 950 of FIG. 9.

When the voltage of the node Y transitions rapidly, the source-gate voltage V_SGSW2 of the second switch SW2 may instantaneously becomes higher than the threshold voltage. In preparation for this case, the clamping diode D2 is provided. Based on the reverse voltage of the clamping diode D2, the value of the source-gate voltage V_SGSW2 of the second switch SW2 in the first steady state is determined. That is, the source-gate voltage V_SGSW2 of the second switch SW2 may be determined based on the reverse voltage of the clamping diode D2 in the first steady state, and may be determined based on the threshold voltage VT,SW4 of the fourth switch SW4 in the second steady state. This overshoot and the stabilization transient response using the clamping diode D2 are shown by the curve 940 of FIG. 9.

When the voltage of the node Y transitions rapidly and thus the second switch SW2 is turned on, the voltage of the node X rapidly increases to a voltage close to the voltage of the first power supply VBAT. The node X has the same voltage as the first power supply VBAT. As a result, the source-gate voltage V_SGPSW of the first pass switch PSW becomes 0, and the level shifter circuit 600 reaches the first steady state.

Although the sixth switch SW6 is shown as short-circuiting the nodes on both sides of the second capacitor C2 in the second steady state in FIG. 6, the nodes on both sides of the second capacitor C2 are not necessarily short-circuited in the second steady state for the same reason for the first capacitor C1. The voltage between the nodes on both sides of the second capacitor C2 may be designed to have a predetermined value, not 0. In this case, it is sufficient if a voltage between the second power supply to which the node on one side of the second capacitor C2 is connected and the nodes on both sides of the second capacitor C2 in the second steady state can drop Vy in the second steady state using charge sharing. The voltage of the node on the other side of the first capacitor C1 in the first steady state may be designed such that the target voltage of Vx in the first steady state is located between the voltage of the node on the other side of the second capacitor C2, not the node on one side of the second capacitor C2 connected to the second power supply, in the second steady state and Vx,o in the second steady state.

As a result of the charge sharing between the parasitic capacitance Cy and the second capacitor C2, Vy is determined based on the ratio between the parasitic capacitance Cy and the capacitance C2 of the second capacitor C2. In this case, even when Vy decreases excessively rapidly because C2 is high, V_SGSW2 is clamped by the cursor clamping diode D2 and thus the second switch SW2 and the fourth switch SW4 can be protected, with the result that a high degree of freedom is present in the design of C2.

That is, even when an error occurs in the value of the modeled parasitic capacitance Cy due to a change in the temperature, manufacturing process or environment, a safety device, such as the clamping circuit D2, is present as described above, and thus a high degree of freedom in design is present in connection with connection with the determination of the value of the second capacitor C2.

Referring back to FIG. 9, the state in which the input control signal Φ1 and the inverted input control signal Φ2 are all OFF is present between both signals. A time interval where t2<t<t3 and a time interval where t4<t<t5 correspond to this state. If the input control signal Φ1 and the inverted input control signal Φ2 are all in an ON state at the same time, a current path extending from the node X or node Y to the ground GND is formed. Depending on a bias condition, a very high through current may flow from the first power supply VBAT to the ground GND. Since such as through current may seriously degrade the efficiency of the level shifter circuit 600, the input control signal Φ1 and the inverted input control signal Φ2 must be designed such that they do not become ON at the same time.

Meanwhile, in a transient state in which the transition from the second steady state to the first steady state is performed, i.e., in the state in which the input control signal Φ1 has become OFF and the inverted input control signal Φ2 has not become ON yet, the source-gate voltage V_SGPSW of the first pass switch PSW exhibits transient response characteristics attributable to the time constant R1·Cx. The time interval where t4<t<t5, shown in FIG. 9, corresponds to this case. As the source-gate voltage V_SGPSW of the first pass switch PSW exhibits a longer transient response time attributable to the time constant R1·Cx, the magnitude of leakage charge generated from the first power supply VBAT becomes higher. Accordingly, a time interval where t4<t<t5 after the input control signal Φ1 has become OFF and before the inverted input control signal Φ2 becomes ON needs to be designed such that the time interval is not excessively long. That is, it is sufficient if the time interval after the input control signal Φ1 has become OFF and before the inverted input control signal Φ2 becomes ON is the time sufficient for the first switch SW1 and the sixth switch SW6 to be opened after the input control signal Φ1 has become OFF. A time interval longer than the above time interval may be the cause that the efficiency of the level shifter circuit 600 is degraded.

In a transient state in which a transition from the first steady state to the second steady state is performed, i.e., in the state in which the inverted input control signal Φ2 has become OFF and the input control signal Φ1 has not become ON yet, a current flowing through the fourth switch SW4 becomes 0 because the third switch SW3 has been turned off. Accordingly, the source-gate voltage of the fourth switch SW4 becomes the threshold voltage VT,SW4 of the fourth switch SW4, and the source-gate voltage of the fourth switch SW4 maintains the threshold voltage VT,SW4 of the fourth switch SW4 in the second steady state. This transient response is shown by the curve 910 of FIG. 9.

FIG. 10 is an operation flowchart showing a method of controlling a level shifter circuit according to an embodiment of the present invention.

Referring to FIG. 10, when the output signal OUT of the level shifter circuit 600 is in a first steady state (in a low state), the level shifter circuit 600 controls the fifth switch SW5 so that the node on one side of the first capacitor C1 has a first voltage level having a polarity opposite that of the voltage Vx of the control node (node X) of the first pass switch PSW at step S1010.

Alternatively, according to another embodiment of the present invention, instead of using the fifth switch SW5, it may be possible to control a circuit around the first capacitor C1 such that a predetermined first voltage level, not 0, is applied to the node on one side of the first capacitor C1, as described above.

The level shifter circuit 600 connects the control node (node X) of the first pass switch PSW with the node on one side of the first capacitor C1 using the first switch SW1 in response to the first switching operation in which the output signal OUT switches from the voltage level of the second power supply GND to the voltage level of the first power supply VBAT at step S1020.

The level shifter circuit 600 may accelerate the transition of the voltage Vx of the control node (node X) of the first pass switch PSW at step S1030. Step S1030 corresponds to the rapid transition of V_SGPSW or Vx shown in the curve 920 of FIG. 9. This rapid transition is generated by charge sharing between the node X and the first capacitor C1, as described above. That is, since the node X is connected with the node on one side of the first capacitor C1 at step S1020, charge sharing occurs at step S1030, and thus the transition of the voltage of the node X may be accelerated.

In this case, the voltage Vx of the node X transitions from the first state VBAT to the second state (VBAT−IB1·R1). A designer may determine the magnitude of the first capacitor C1 while predicting the magnitude of the parasitic capacitance Cx of the node X and also taking into account the operating range of the possible source-gate voltage of the first pass switch PSW.

The first state value of the first capacitor C1 in the first steady state may be viewed as corresponding to an electric potential with which the first capacitor C1 is charged. The voltage of the node X immediately after charge sharing may be determined based on the difference between the first state value of the first capacitor C1 and the first state (high) value (voltage VBAT) of the node X during the charge sharing.

FIG. 11 is an operation flowchart showing a method of controlling a level shifter circuit according to another embodiment of the present invention.

Referring to FIG. 11, when the output signal OUT is in the second steady state (has the voltage level of the first power supply VBAT), the level shifter 600 controls the sixth switch SW6 so that a node on one side of the second capacitor C2 has a first voltage level at step S1110.

The level shifter 600 connects the control node (node Y) of the second switch SW2 with the node on one side of the second capacitor C2 (controlled to the first voltage level) in response to the second switching operation in which the output signal OUT transitions from the second steady state to the first steady state (GND) at step S1120.

After step S1120, charge sharing between the node Y and the node on one side of the second capacitor C2 occurs and thus the transition of the voltage Vy of the node Y is accelerated at step S1130.

In this case, the voltage of the node on one side of the second capacitor C2 may be viewed as the second state value of the second capacitor C2. In the second steady state, the voltage level of the node Y immediately after the charge sharing may be determined based on the difference between the voltage value of the node Y and the second state value of the second capacitor C2.

When the voltage of the node Y decreases rapidly, the second switch SW2 is turned on, and thus the node X, i.e., the control node of the first pass switch PSW, is charged. That is, the transition of the voltage of the node Y, i.e., the control node of the second switch SW2, is accelerated, and the transition of the voltage of the node X is also accelerated at step S1140.

The present invention is characterized in that it is configured to, in the transition of the voltage of the node X from the first steady state $V_{x,0}$ to the second steady state $V_{x,1}$, apply a charge sharing technique prior to a transient response attributable to an RC delay, thereby promoting a rapid transition from the first steady state $V_{x,0}$ to the preliminary second state $V_{x,0+}$ before the second steady state $V_{x,1}$.

The charge sharing is applied to change the start point of the transient response to the preliminary second state close to the second steady state in order to reduce the transient response time attributable to the RC delay. The capacitor configured to generate charge sharing and the voltage with which the capacitor is pre-charged may be designed based on the start point of the voltage adapted to reduce the transient response time.

According to at least one embodiment of the present invention, in a level shifter circuit, RC delay can be reduced, and time response can be accelerated.

According to at least one embodiment of the present invention, a level shifter that has time response characteristics and operates in a wide voltage range can be implemented. Furthermore, a wide voltage range can be dealt with, operation-related limitations attributable to the characteristics of transistors, such as a breakdown voltage, etc., can be minimized, and a high-voltage level shifter can implement a fast switching operation in various applications.

In the conventional technology, when the voltage range of an output signal is considerably higher than the voltage range of the input digital logic signal of a level shifter, a problem with the safety of the transistors of a level shifter circuit may occur. Since a transistor for a high voltage and a transistor for a low voltage must be used in a mixed manner, it may be difficult to design a circuit, and various protection circuits for safety must be added in order for the transistors to operate without destruction in a high voltage-low voltage interface. For this reason, when the high-voltage level shifter operates, a problem occurs in that performance, such as operation speed, efficiency or like, is degraded. The present invention proposes a circuit that can implement both the safe operation and fast operation of transistors in a high-voltage level shifter circuit while overcoming the above problem of the conventional technology.

According to at least one embodiment of the present invention, a circuit that provides a stable, rapid high-voltage switching operation regardless of the characteristics, such as the threshold voltage of transistors, etc., of the elements of the circuit can be designed, and a very high degree of freedom in terms of design is achieved in connection with the determination of the areas of elements, such as transistors and a resistor, because the number of factors that should be taken into account by a designer during circuit design is small. For the same reason, the number of limitations to circuit design is small, and thus the performance of a circuit can be easily optimized.

According to at least one embodiment of the present invention, it is possible to improve time response performance while satisfying a low Vgs condition required to protect the pass switch of the output stage circuit of the level shifter that transfers a high voltage level, and also it is possible to reduce the transient time it takes for the pass switch of the output stage circuit of the level shifter to reach a desired operating state, thereby reducing leakage current during the transient time.

According to at least one embodiment of the present invention, it is possible to reduce the transient time it takes for the level shifter including the pass switch to reach a desired operating state, thereby reducing leakage current and also effectively achieving performance that an application intends to achieve.

While the present invention has been described in conjunction with specific details, such as specific elements, and limited embodiments and diagrams above, these are provided merely to help an overall understanding of the present invention. The present invention is not limited to these embodiments, and various modifications and variations can be made based on the foregoing description by those having ordinary knowledge in the art to which the present invention pertains.

Accordingly, the technical idea of the present invention should not be determined based on only the described embodiments, and the following claims, all equivalents to the claims and equivalent modifications should be construed as falling within the scope of the idea of the present invention.

What is claimed is:

1. A level shifter circuit, comprising:
an output stage circuit of a level shifter comprising a first pass switch configured to transfer a voltage level of a first power supply of the level shifter to an output node, and a second pass switch connected between a second power supply and the first pass switch; and a booster circuit configured to accelerate a switching operation of the level shifter by accelerating a time response during a turning on or off operation of the first pass switch based on charge sharing via a first switch between a first capacitor and a parasitic capacitance of a control node of the first pass switch, wherein a node on one side of the first capacitor of the booster circuit has a voltage at a first voltage level when an output signal of the level shifter is in a first steady state;

the first voltage level has an inverted polarity of a voltage of the control node of the first pass switch in the first steady state; and the first switch of the booster circuit connects the node on the one side of the first capacitor with the control node of the first pass switch when the switching operation that allows the output signal to depart from the first steady state is initiated.

2. The level shifter circuit of claim 1, wherein the booster circuit accelerates an early stage transient response of transition of the voltage of the control node of the first pass switch during the switching operation of the level shifter.

3. The level shifter circuit of claim 1, wherein when the first switch connects the node on the one side of the first capacitor with the control node of the first pass switch, a transition of the voltage of the control node of the first pass switch is accelerated by the charge sharing between the parasitic capacitance of the control node of the first pass switch and the first capacitor, a transition of a turning on or off state of the first pass switch is accelerated, and a transition in which the output signal departs from the first steady state is accelerated.

4. The level shifter circuit of claim 1, further comprising a bias circuit configured to control a voltage between the control node of the first pass switch and the first power supply to a predetermined level after the output signal has departed from the first steady state and before the output signal reaches a second steady state.

5. The level shifter circuit of claim 1, further comprising a clamping circuit connected between the control node of the first pass switch and the first power supply, and configured to regulate a voltage between the control node of the first pass switch and the first power supply so that the voltage does not exceed a critical range.

6. The level shifter circuit of claim 1, wherein the booster circuit comprises:
a first booster circuit configured to accelerate a first switching operation in which the output signal departs from the first steady state and reaches a second steady state by accelerating a time response during a turning on operation of the first pass switch; and
a second booster circuit configured to accelerate a second switching operation in which the output signal departs from the second steady state and reaches the first steady state by accelerating a time response during a turning off operation of the first pass switch.

7. A level shifter circuit, comprising:
an output stage circuit of a level shifter comprising a first pass switch configured to transfer a voltage level from a first power supply of the level shifter to an output node, and a second pass switch connected between a second power supply and the first pass switch;

a first capacitor configured such that a node on one side thereof has a voltage at a first voltage level when a voltage of a control node of the first pass switch is in a first state, wherein the first voltage level has an inverted polarity of the voltage of the control node of the first pass switch; and a first switch configured to connect the node on one side of the first capacitor with the control node of the first pass switch;

wherein when the first switch is turned on, a transition of a voltage of the control node of the first pass switch from a first state to a second state is accelerated by charge sharing between a parasitic capacitance of the control node of the first pass switch and the first capacitor.

8. The level shifter circuit of claim 7, further comprising:
a resistor connected between the control node of the first pass switch and the first power supply; and
a current source connected to the control node of the first pass switch via the first switch.

9. The level shifter circuit of claim 7, further comprising a clamping circuit connected between the control node of the first pass switch and the first power supply.

10. A level shifter circuit, comprising:
an output stage circuit of a level shifter comprising a first pass switch configured to transfer a voltage level from a first power supply of the level shifter to an output node, and a second pass switch connected between a second power supply and the first pass switch;
a first capacitor configured such that a node on one side thereof has a voltage at a first voltage level when a voltage of a control node of the first pass switch is in a first state;
a first switch configured to connect the node on one side of the first capacitor with the control node of the first pass switch,
wherein when the first switch is turned on, a transition of a voltage of the control node of the first pass switch from a first state to a second state is accelerated by charge sharing between a parasitic capacitance of the control node of the first pass switch and the first capacitor;
a second switch connected between the control node of the first pass switch and the first power supply;
a third switch connected to a control node of the second switch; and
a second capacitor configured such that a node on one side thereof is connected to the control node of the second switch via the third switch and has a second voltage level when the voltage of the control node of the first pass switch is in a second state.

11. The level shifter circuit of claim 10, wherein when the third switch is turned on, a transition of a voltage of the control node of the second switch is accelerated by charge sharing between a parasitic capacitance of the control node of the second switch and the second capacitor, and a transition of the voltage of the control node of the first pass switch from the second state to the first state is accelerated in response to the accelerated transition of the voltage of the control node of the second switch.

12. A method of controlling a level shifter, comprising:
controlling a first capacitor of a booster circuit to have a first state value when an output signal of a level shifter generated by an output stage circuit including a first pass switch and a second pass switch is in a first steady state; and accelerating a switching operation of the first pass switch, based on charge sharing between the first capacitor and a parasitic capacitance of a control node of the first pass switch and the first state value of the first capacitor, in response to a first switching operation in which the output signal transitions from the first steady state to a second steady state, wherein the first state value corresponds to an inverted polarity of a voltage of the control node of the first pass switch.

13. The method of claim 12, wherein the accelerating the switching operation of the first pass switch comprises accelerating a transition of the voltage of the control node of the first pass switch from a first state to a second state based on the first state value of the first capacitor.

14. The method of claim 13, wherein the accelerating the switching operation of the first pass switch comprises:
- connecting the control node of the first pass switch with a node on one side of the first capacitor using a closing operation of the first switch that is connected between the control node of the first pass switch and the node on one side of the first capacitor; and
- accelerating a transition of the voltage of the control node of the first pass switch based on a difference between the first state value of the first capacitor and a state value of the first state of the control node of the first pass switch.

15. The method of claim 12, wherein the accelerating the switching operation of the first pass switch comprises accelerating a transition of the voltage of the control node of the first pass switch from a first state to a second state by charge sharing between the first capacitor, having the first state value, and the parasitic capacitance of the control node of the first pass switch.

16. A method of controlling a level shifter, comprising:
- controlling a first capacitor of a booster circuit to have a first state value when an output signal of a level shifter generated by an output stage circuit including a first pass switch and a second pass switch is in a first steady state;
- accelerating a switching operation of the first pass switch, based on charge sharing between the first capacitor and a parasitic capacitance of a control node of the first pass switch and the first state value of the first capacitor, in response to a first switching operation in which the output signal transitions from the first steady state to a second steady state;
- controlling a second capacitor of the booster circuit to have a second state value when the output signal of the level shifter is in the second steady state; and
- accelerating the switching operation of the first pass switch based on the second state value of the second capacitor in response to a second switching operation in which the output signal transitions from the second steady state to the first steady state.

17. The method of claim 16, wherein the accelerating the switching operation of the first pass switch based on the second state value of the second capacitor comprises:
- accelerating a transition of a voltage of a control node of a second switch, connected to the control node of the first pass switch, using a closing operation of a third switch that is connected between the control node of the second switch and a node on one side of the second capacitor; and
- accelerating a transition of a voltage of the control node of the first pass switch from a second state to a first state in response to the accelerated transition of the voltage of the control node of the second switch.

18. The method of claim 16, wherein the accelerating the switching operation of the first pass switch based on the second state value of the second capacitor comprises:
- accelerating a transition of a voltage of a control node of a second switch, connected to the control node of the first pass switch, by charge sharing between the control node of the second switch and a node on one side of the second capacitor; and
- accelerating a transition of a voltage of the control node of the first pass switch from a second state to a first state in response to the accelerated transition of the voltage of the control node of the second switch.

\* \* \* \* \*